(12) United States Patent
Wan et al.

(10) Patent No.: US 10,525,464 B2
(45) Date of Patent: Jan. 7, 2020

(54) MICROSCALE FLUIDIC DEVICES AND COMPONENTS HAVING A FLUID RETENTION GROOVE

(71) Applicant: Bio-Rad Laboratories, Inc., Hercules, CA (US)

(72) Inventors: Alwin Wan, Toronto (CA); Amir Sadri, Toronto (CA); Tal Rosenzweig, Toronto (CA); Nenad Kircanski, Toronto (CA); Edmond Young, Toronto (CA)

(73) Assignee: Bio-Rad Laboratories, Inc., Hercules, CA (US)

( * ) Notice: Subject to any disclaimer, the term of this patent is extended or adjusted under 35 U.S.C. 154(b) by 183 days.

(21) Appl. No.: 15/508,027

(22) PCT Filed: Aug. 25, 2015

(86) PCT No.: PCT/US2015/046718
§ 371 (c)(1),
(2) Date: Mar. 1, 2017

(87) PCT Pub. No.: WO2016/036536
PCT Pub. Date: Mar. 10, 2016

(65) Prior Publication Data
US 2017/0297019 A1  Oct. 19, 2017

Related U.S. Application Data

(60) Provisional application No. 62/044,489, filed on Sep. 2, 2014.

(51) Int. Cl.
*B01L 3/00* (2006.01)
*B81C 3/00* (2006.01)
(Continued)

(52) U.S. Cl.
CPC .... *B01L 3/502707* (2013.01); *B29C 65/4895* (2013.01); *B29C 66/1122* (2013.01);
(Continued)

(58) Field of Classification Search
CPC ....... B29C 66/53461; B01L 2300/0816; B01L 2200/027; B01L 2300/0864;
(Continued)

(56) References Cited

U.S. PATENT DOCUMENTS

2002/0031821 A1  3/2002  Parce et al.
2006/0078470 A1*  4/2006  Zhou ............... B01F 5/0683
                                                422/503
(Continued)

FOREIGN PATENT DOCUMENTS

CN  1092293 A  1/2007
DE  4414915 A1  2/1995
(Continued)

OTHER PUBLICATIONS

Bhushan, B., "Springer Handbook of Nanotechnology", second edition, Springer Science & Business Media, Chapter 19, Section 19.1, Mar. 27, 2007, p. 525.
(Continued)

*Primary Examiner* — Dennis White
*Assistant Examiner* — Bryan Kilpatrick
(74) *Attorney, Agent, or Firm* — Kilpatrick Townsend and Stockton LLP

(57) ABSTRACT

Microscale fluidic devices and components thereof having a fluid retention groove, as well as systems and methods related thereto. The fluid retention groove facilitates uniform bonding of microfluidic device components.

29 Claims, 9 Drawing Sheets

(51) Int. Cl.
*B81B 1/00* (2006.01)
*B29C 65/48* (2006.01)
*B29C 65/00* (2006.01)
*B29L 31/00* (2006.01)

(52) U.S. Cl.
CPC ........ *B29C 66/45* (2013.01); *B29C 66/73921* (2013.01); *B81B 1/00* (2013.01); *B81C 3/001* (2013.01); *B01L 2200/027* (2013.01); *B01L 2200/0689* (2013.01); *B01L 2200/16* (2013.01); *B01L 2300/08* (2013.01); *B01L 2300/0816* (2013.01); *B01L 2300/0864* (2013.01); *B01L 2300/0887* (2013.01); *B29C 66/53461* (2013.01); *B29C 66/71* (2013.01); *B29L 2031/756* (2013.01); *B81B 2201/058* (2013.01); *B81B 2203/0338* (2013.01); *B81C 2203/032* (2013.01); *B81C 2203/036* (2013.01); *B81C 2203/057* (2013.01)

(58) Field of Classification Search
CPC .......... B01L 3/502776; G01N 15/1484; G01N 15/1056; B81B 2201/058
See application file for complete search history.

(56) References Cited

U.S. PATENT DOCUMENTS

| | | |
|---|---|---|
| 2007/0141805 A1 | 7/2007 | Chang et al. |
| 2008/0138245 A1 | 6/2008 | Kim et al. |
| 2008/0166188 A1* | 7/2008 | Gilbert .............. B01L 3/502776 406/198 |
| 2011/0182775 A1 | 7/2011 | Kitamura et al. |
| 2013/0327936 A1 | 12/2013 | Ramsey et al. |
| 2014/0024126 A1 | 1/2014 | Ogusu |
| 2014/0178267 A1 | 6/2014 | Lim et al. |
| 2015/0064694 A1 | 3/2015 | Sadri et al. |

FOREIGN PATENT DOCUMENTS

| | | |
|---|---|---|
| DE | 19850041 A1 | 4/2000 |
| JP | 2003-255390 A | 9/2003 |
| KR | 1020110075448 | 7/2011 |
| WO | 2006/043922 A1 | 4/2006 |

OTHER PUBLICATIONS

Brown, et al., "Fabrication and characterization of poly(methylmethacrylate) microfluidic devices bonded using surface modifications and solvents", Lab Chip, 2006, vol. 6, pp. 66-73.

Tsao, et al., "Bonding of thermoplastic polymer microfluidics", Microfluid Nanofluid, 2009, vol. 6, pp. 1-16.

Zhou, et al., "Weak solvent based chip lamination and characterization of on-chip valve and pump", Biomed Microdevices, 2010, vol. 12, pp. 821-832.

International Search Report and Written Opinion for International Patent Application No. PCT/US2015/046718, dated Dec. 4, 2015, 11 pages.

Extended European Search Report from Appln. No. 15838966.8 dated Feb. 7, 2018.

* cited by examiner

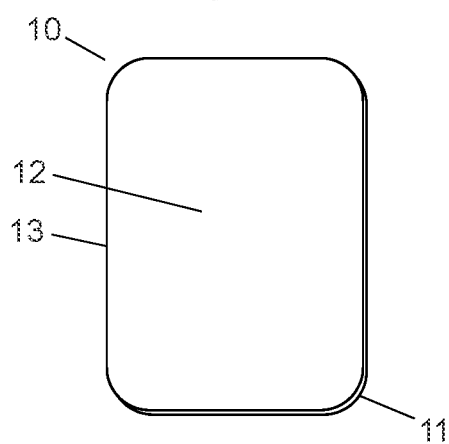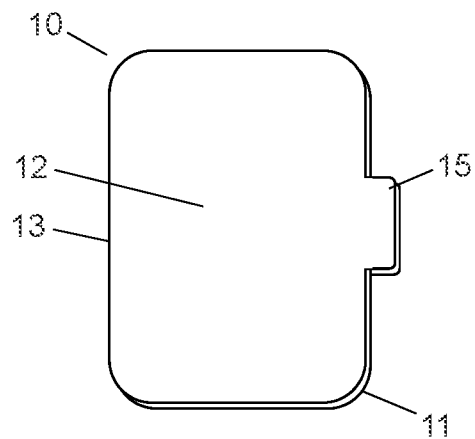

MICROSCALE FLUIDIC DEVICES AND COMPONENTS HAVING A FLUID RETENTION GROOVE

CROSS-REFERENCE TO RELATED PATENT APPLICATIONS

This application is a 371 national stage application of International Application No. PCT/US2015/046718, filed Aug. 25, 2015, which claims the benefit of priority to U.S. Provisional Application Ser. No. 62/044,489, filed Sep. 2, 2015. Both of these applications are incorporated herein by reference in their entirety.

BACKGROUND

Microfluidics is a multidisciplinary field intersecting engineering, physics, chemistry, biochemistry, nanotechnology, and biotechnology, with practical applications to the design of systems in which small volumes of fluids will be handled. Microfluidics emerged in the beginning of the 1980s and is used, for example, in the development of lab-on-a-chip technology. Microscale fluidic devices (or microfluidic devices) are compact, easy to use, and often have more functions than traditional technologies. Because their small feature sizes are on a similar physical scale to many biomolecules, they are increasingly being used for biomedical applications such as in labs and clinics for analyzing biological materials.

BRIEF SUMMARY

The present disclosure provides microfluidic device components. In some aspects, the microfluidic device components include a planar substrate having a planar surface, wherein the planar surface comprises a central portion, a peripheral edge, and a groove having a cross-section defined in the planar surface, and wherein the groove aligns along the peripheral edge of the planar surface.

In some aspects, the groove is a single continuous groove.

In some aspects, the groove is discontinuous.

In some aspects, the planar surface comprises two grooves defined therein.

In some aspects, the planar surface further comprises a microfluidic channel or a microfluidic chamber defined therein.

In some aspects, the microfluidic channel or the microfluidic chamber is within the central portion of the planar surface.

In some aspects, the microfluidic channel or the microfluidic chamber is positioned within the perimeter of the groove.

In some aspects, a second fluid retention groove is defined in the planar surface to surround the microfluidic channel or the microfluidic chamber.

In some aspects, the planar surface comprises a port defined therein.

In some aspects, a microfluidic channel extends to the peripheral edge of the planar surface thereby forming an outlet, and wherein a first end and a second end of the groove flank the microfluidic channel.

In some aspects, the microfluidic channel is on a protrusion of the planar substrate.

In some aspects, the planar substrate comprises a portion of an outlet, wherein the portion of the outlet comprises a microfluidic channel defined in the planar surface that extends from the central portion of the planar surface to the peripheral edge of the planar surface.

In some aspects, a first end and a second end of the groove flank the microfluidic channel that is part of the outlet.

In some aspects, the first end and the second end of the groove are in a protrusion of the planar substrate within which the microfluidic channel that is part of the port is defined.

In some aspects, the planar substrate includes a protrusion.

In some aspects, the groove comprises an interior surface and a recess defined therein, wherein the recess joins the interior surface of the groove to the peripheral edge of the planar surface.

In some aspects, the cross-section of the groove comprises a square shape, a rounded shape, or a triangular shape.

In some aspects, the cross-section of the groove comprises a uniform shape.

In some aspects, the cross-section of the groove comprises a uniform depth or width.

In some aspects, at least a portion of the cross-section of the groove has a depth of about 0.2 mm to about 1.0 mm.

In some aspects, at least a portion of the cross-section of the groove has a width of at least about 0.2 mm.

In some aspects, the planar substrate comprises a polymer.

In some aspects, the planar substrate comprises an acrylate, a polycarbonate, a polystyrene, a copolymer (COC), or a cylic-olefin-polymer (COP).

In some aspects, the acrylate comprises poly(methyl methacrylate) (PMMA).

In some aspects, the groove is defined by etching, micromilling, hot embossing, stamping, or injection-molding.

The present disclosure also provides microfluidic devices. In some aspects, the devices include:

a first planar substrate having a first planar surface that includes a first central portion, a first peripheral edge, and a groove having a cross-section defined in the first planar surface, wherein the groove aligns along the first peripheral edge of the first planar surface, and a second planar substrate having a second planar surface that includes a second central portion and a second peripheral edge, wherein the second planar surface of the second planar substrate is adjoined to the first planar surface of the first planar substrate.

In some aspects, the first planar substrate and the second planar substrate are the same shape.

In some aspects, the peripheral edge of the first planar substrate and the second peripheral edge of the second planar substrate are aligned, and wherein the central portion of the first planar substrate and the second central portion of the second planar substrate are aligned.

In some aspects, the second planar surface further comprises a microfluidic channel or a microfluidic chamber defined within the second central portion of the second planar surface.

In some aspects, the microfluidic channel or the microfluidic chamber in the second planar surface of the second planar substrate is within the perimeter of the groove of the first planar substrate when the first planar surface and the second planar surface are aligned.

In some aspects, a second fluid retention groove is defined in the second planar surface to surround the microfluidic channel or the microfluidic chamber.

In some aspects, the planar surface of the first planar substrate has a microfluidic channel defined therein, wherein the microfluidic channel extends from the peripheral edge of the first planar surface into the central portion of the first planar surface.

In some aspects, the groove in the planar surface of the first planar substrate comprises a first end and a second end that flank the microfluidic channel in the planar surface of the first planar substrate.

In some aspects, a second fluid retention groove is defined in the first planar surface to surround the microfluidic channel or the microfluidic chamber.

In some aspects, the microfluidic channel in the second planar surface of the second planar substrate extends from the second peripheral edge of the second planar surface into the second central portion of the second planar surface.

In some aspects, the groove in the planar surface of the first planar substrate comprises a first end and a second end that flank the microfluidic channel in the second planar surface of the second planar substrate when the first planar surface and the second planar surface are aligned.

In some aspects, the microfluidic channel in the planar substrate or the microfluidic channel in the second planar substrate extends through a protrusion of the microfluidic device.

In some aspects, the microfluidic device includes a port.

In some aspects, the port is defined in the first planar surface of the first planar substrate.

In some aspects, the port is defined in the second planar surface of the second planar substrate.

In some aspects, the microfluidic device includes an outlet.

In some aspects, the outlet comprises a microfluidic channel defined in the first planar surface of the first planar substrate, wherein the microfluidic channel extends from the peripheral edge of the planar surface into the central portion of the planar surface.

In some aspects, the outlet comprises a microfluidic channel defined in the second planar surface of the second planar substrate, wherein the microfluidic channel extends from the second peripheral edge of the second planar surface into the second central portion of the second planar surface.

In some aspects, the device comprises a protrusion, wherein the protrusion comprises a first protrusion of the first planar substrate and a second protrusion of the second planar substrate.

The present disclosure also provides methods for making microfluidic devices. In some aspects, the method comprises in the following order, (a) providing a first planar substrate, wherein the first planar substrate (b) providing a second planar substrate, wherein the second planar substrate comprises a second planar surface, wherein the second planar surface comprises a second central portion and a second peripheral edge;

(c) applying solvent to at least one of the first planar surface or the second planar surface; and (d) contacting the first planar surface to the second planar surface, wherein the solvent partially dissolves each of the surfaces thereby bonding the two surfaces together.

In some aspects, the method further comprises applying pressure or heat to the first and second planar surfaces to facilitate bonding.

In some aspects, the pressure applied to the first and second planar surfaces is 5 PSI to 1000 PSI.

In some aspects, the heat applied to the first and second planar surfaces is 37° C. to 90° C.

In some aspects, the solvent comprises an organic solvent.

In some aspects, the solvent comprises acetone or isopropanol, dichloromethane, n-hexanol, chloroform, or acetonitrile.

In some aspects, the solvent comprises between about 40% and 100% acetone.

In some aspects, the method further comprising applying $O_2$ plasma to the first planar substrate or the second planar substrate.

In some aspects, the method further comprising applying the solvent to the first planar substrate and the second planar substrate.

It will be appreciated from a review of the remainder of this application that further methods and compositions are also part of the disclosure.

BRIEF DESCRIPTION OF THE DRAWINGS

FIGS. 2A-2J are illustrations of component planar substrates according to some embodiments.

DETAILED DESCRIPTION

Figure 1A:
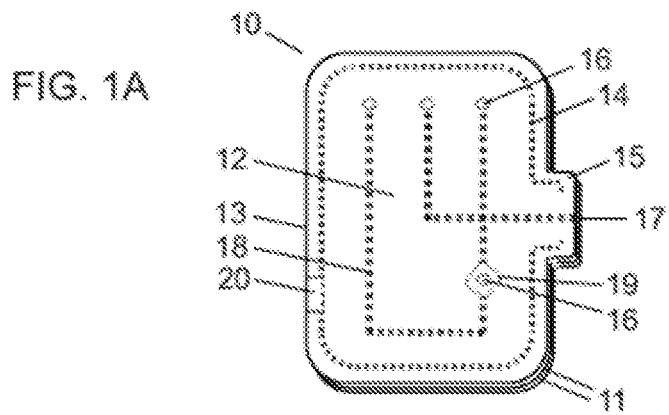
FIG. 1A is an illustration of a device according to some embodiments.

Certain embodiments and features of the present disclosure relate to microfluidic devices having a fluid retention groove that facilitates bonding of microfluidic device components to each other. For example, an illustrative microscale fluidic device according to one embodiment is made up of two substantially planar pieces of a polymer material. Each of the two pieces has one or more bonding areas where solvent will be applied to cause the two pieces to bond when they are pressed together. In one of the two planar pieces, a groove is formed around the perimeter of the piece to hold excess solvent that is applied to the bonding areas. The other planar piece has a number of channels formed into it in which a particular chemical or biological reaction is to occur in the device after the pieces are bonded and upon a later addition of the appropriate chemicals, reagents, or samples.

To create the final microscale fluidic device, a solvent is applied to the bonding areas of at least one of the two planar pieces, and the two pieces are pressed together. During this process, excess solvent will move out from between the bonding areas and into the groove. The groove prevents an interfacial contact line from forming at the edge of the two pieces and within the perimeter of the groove so that there is uniform bonding between the bonding surfaces of the two pieces. For example, the fluid retention groove prevents solvent applied near the edges of the pieces from dissipating quickly (for example, due to evaporation or receding), which can result in poor bonding of microfluidic device components along the outer edges of the pieces. This effect can improve the quality of the bond between the two pieces and provide a better quality microscale fluidic device.

This illustrative embodiment has been provided to introduce the subject matter of this disclosure and is not intended to limit the scope of the disclosure. Additional embodiments and features are described throughout this disclosure. For example, certain embodiments and features according to this disclosure relate to microfluidic device components that have a fluid retention groove. Other embodiments and features relate to methods of making microfluidic devices using one or more component planar substrates having a fluid retention groove. The fluid retention groove can be useful for bonding planar substrates to create a single, monolithic device that is durable, leak-free, and possesses highly precise microscale features. In various aspects, the bonding of the different components may be performed by solvent bonding. Solvent bonding can create a strong bond between the contacting surfaces of components with minimal feature deformation or distortion. The disclosure also describes methods for making microscale fluidic devices. Some embodiments described in this disclosure may permit large-scale manufacturing of component planar substrates and devices. For example, methods described may facilitate development of practical and scalable fabrication procedures for polymers, such as plastics. This may permit a smoother transition from prototype to product, accelerate the advancement of microscale technologies, and help to maintain lower production costs. Reference will now be made in detail to implementations of example embodiments as illustrated in the accompanying drawings. The same reference indicators will be used throughout the drawings and the following description to refer to the same or like items.

I. Devices and Components

In one aspect, a microfluidic device is made of at least two components, at least one of which has a fluid retention groove, that are bonded together using a solvent. An example device 10 and example components are shown in FIG. 1A and FIGS. 1B-1E, respectively. The terms "component planar substrate" and "planar substrate" are used interchangeably throughout this disclosure to refer to components that can be bonded together to form the device 10.

Figure 1B:
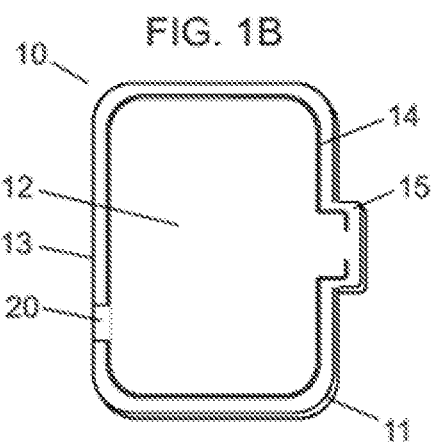
FIGS. 1B-1E are illustrations of component planar substrates according to some embodiments.
Figure 1C:
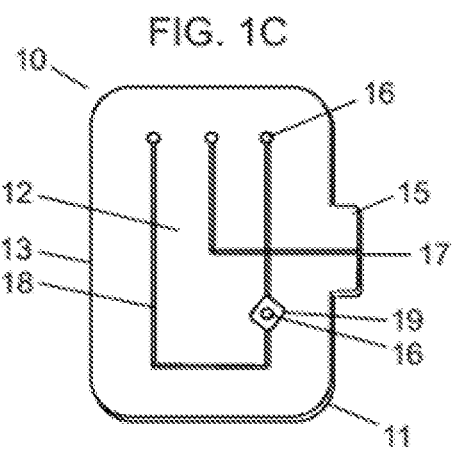
Figure 1D:
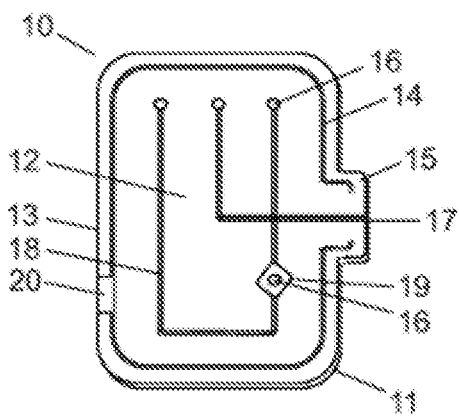
Figure 3A:
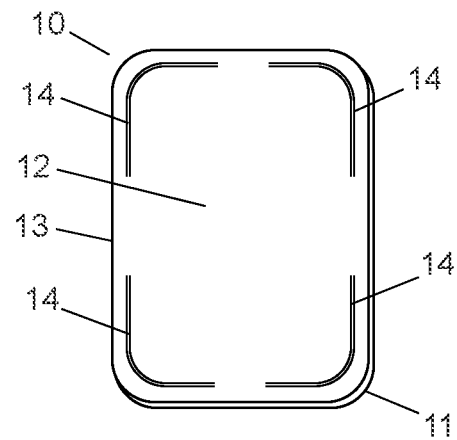
FIGS. 3A and 3B are illustrations of component planar substrates according to some embodiments.
Figure 3B:
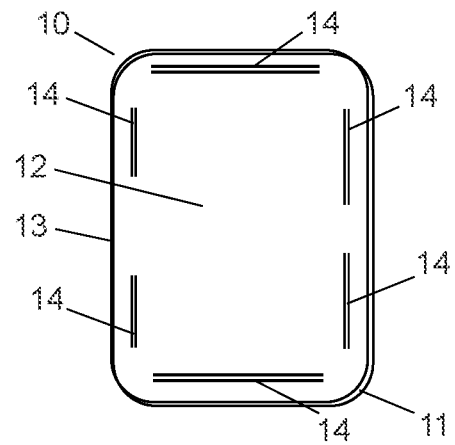
Figure 3C:
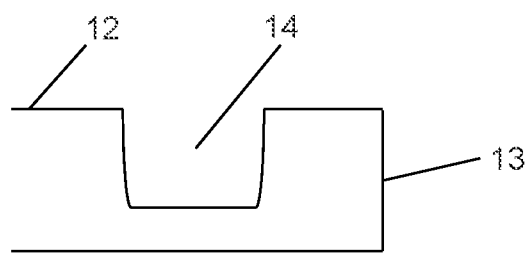
FIGS. 3C-3E are illustrations of cross-sections of a fluid retention groove according to some embodiments.
Figure 3D:
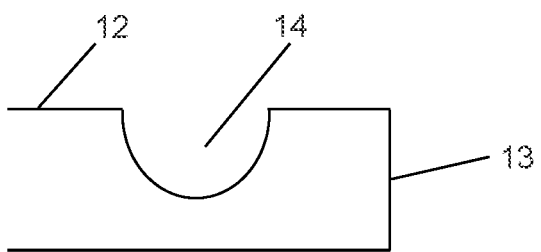
Figure 3E:
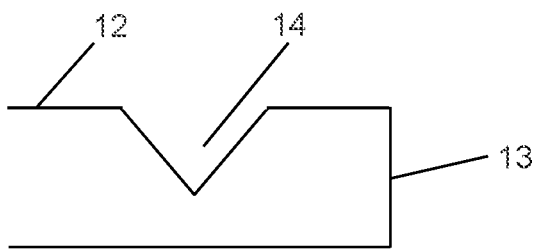

FIG. 1A shows a microfluidic device 10 according to one aspect. The device 10 is made from two component planar substrates 11 that have been bonded together. In this aspect, the device 10 can be formed from the planar substrates 11 shown in FIG. 1B and FIG. 1C. For example, the first component planar substrate 11, as shown in FIG. 1B, has a planar surface. The planar surface has a central portion 12 and a peripheral edge 13. A fluid retention groove 14 has been formed in the planar surface. In this example, the groove 14 has a substantially square-shaped cross-section, as shown in FIG. 3C, but other fluid retention grooves in other aspects may have other cross-sections, such as those shown in FIG. 3D and FIG. 3E. The first planar substrate 11 also includes a recess 20 formed in the groove 14 that joins the interior surface of the groove 14 to the peripheral edge 13 of the planar surface. The first planar substrate 11 also includes a protrusion 15. The groove 14 in the first planar substrate 11 has a first end and a second end that are positioned within the protrusion 15. The second component planar substrate 11, as shown in FIG. 1C, also has a planar surface. In addition, the second planar substrate 11 also includes microfluidic channels 18 and microfluidic chambers 19 formed within the central portion 12 of the planar surface. The second planar substrate 11 also includes ports 16 that are connected to microfluidic channels 18. While in this example, a groove 14 has been formed in the first component and the microfluidic channels 18 and chamber 19 formed in the second component, other aspects may include different features formed into different components. For example, in another aspect, the first component planar substrate 11, as shown in FIG. 1D, includes a groove 14, microfluidic channels 18, and a microfluidic chamber 19 formed in the central portion 12 of the planar surface. The first planar substrate in this example also includes ports 16 connected to the microfluidic channels 18, a recess 20 connecting the groove 14 to the peripheral edge 13 of the planar surface, and a protrusion 15 into which the first and second ends of the groove 14 extend. In this aspect, the second component planar substrate 11, as shown in FIG. 1D, also has a planar surface including a central portion 12 and a peripheral edge 13, as well as a protrusion 15. In both examples, the microfluidic channels 18 and chamber 19 are within the perimeter of the groove 14, which is formed substantially along the peripheral edge 13 of planar substrates 11 as shown in FIG. 1B and FIG. 1D.

Figure 1E:
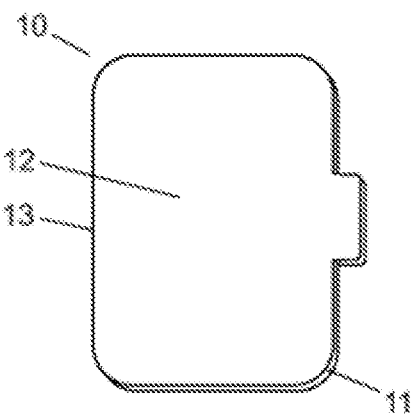

In these examples, the device 10 may optionally include an outlet 17 that is created when the first planar substrate 11 having a microfluidic channel 18 defined therein that extends from the central portion 12 to the peripheral edge 13, such as is shown in FIG. 1C and FIG. 1D, is bonded to a second planar substrate 11, such as shown in FIG. 1B and FIG. 1E, respectively. Thus, an individual component planar substrate 11 may include only a portion of an outlet. However, for simplicity, this disclosure refers to a microfluidic channel 18 opening at the peripheral edge 13 of a planar substrate 11 as an outlet 16 in the context of both devices 10 and component planar substrates 11.

To form the device 10 as shown in FIG. 1A, solvent is applied to one of the planar substrates 11 (in these examples, as shown in FIG. 1B and FIG. 1C or FIG. 1D and FIG. 1E), and then they are aligned and bonded together. In some instances, aligning the planar substrates 11 involves positioning the planar substrates 11 so that the planar surfaces are in contact and the peripheral edges 13 are matched together. In some examples, aligning the planar substrates 11 is performed using a receptacle or machine into which the planar substrates 11 are placed. In some examples, alignment is performed using markings formed on the planar surface of the planar substrates 11.

Figure 2A:
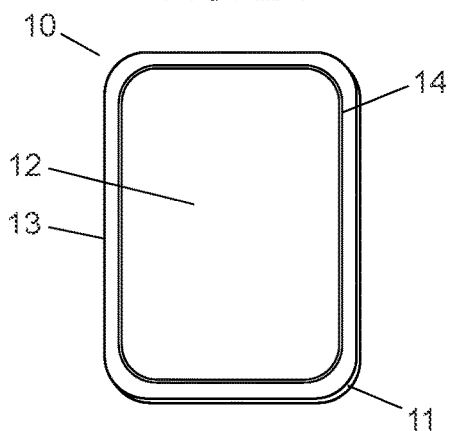
Figure 2B:
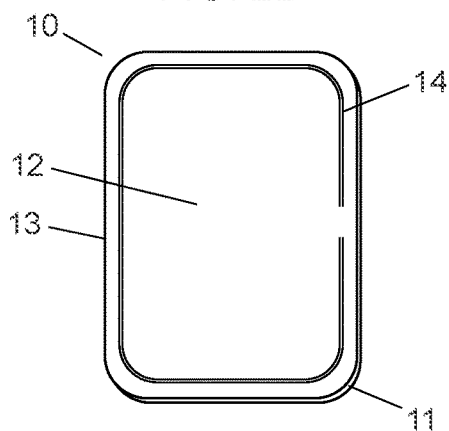
Figure 2C:
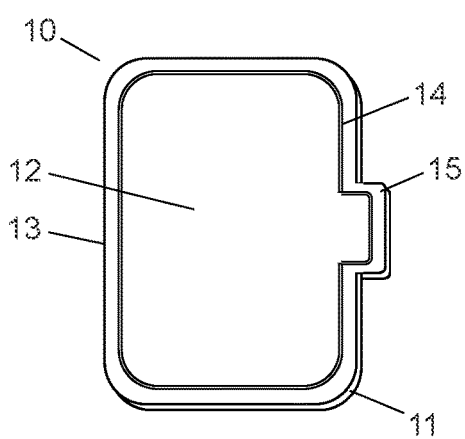
Figure 2D:
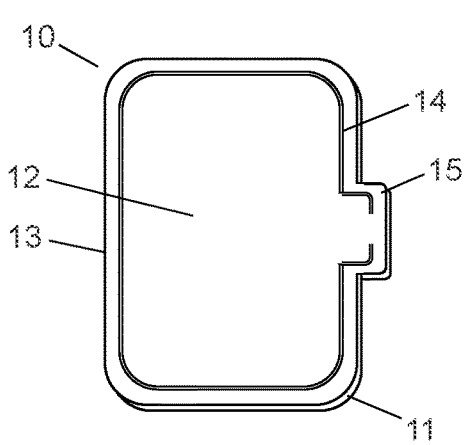
Figure 2E:
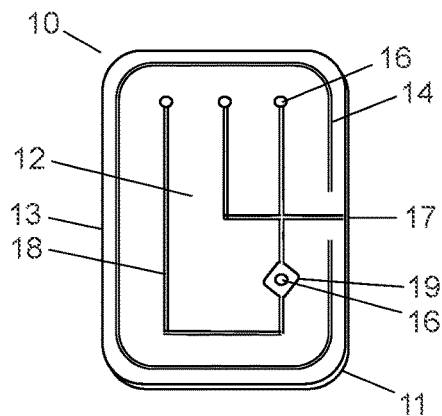
Figure 2F:
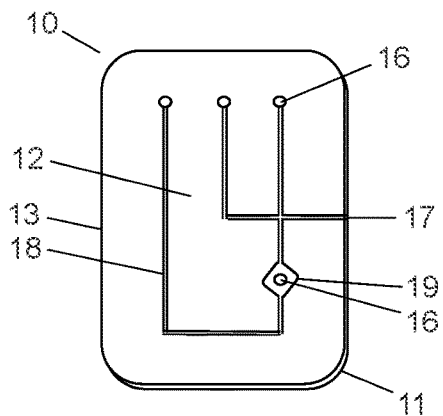
Figure 2G:
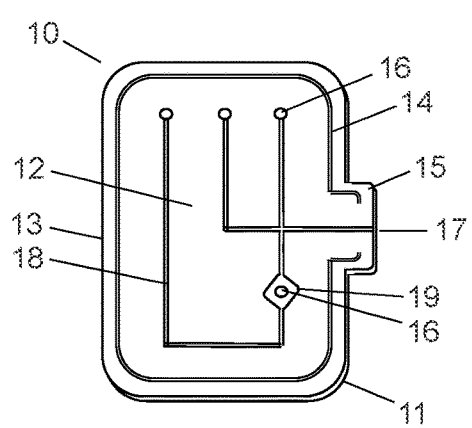
Figure 2H:
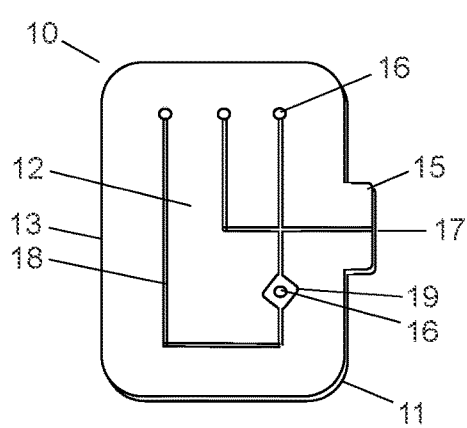

In other aspects, the device 10 can include component planar substrates 11 of various configurations. For example, as detailed above, the device 10 of FIG. 1A may include the planar substrates 11 shown in FIG. 1B and FIG. 1C or the planar substrates 11 shown in FIG. 1D and FIG. 1E. FIG. 2 provides illustrations of various other example planar substrates that can be bonded to form a device 10. For example, a device 10 may include planar substrates 11 of FIGS. 2A and 2I, or FIGS. 2B and 2I, or FIGS. 2C and 2J, or FIGS. 2D and 2J, or FIGS. 2E and 2I or FIGS. 2F and 2B, or FIGS. 2G and 2J, or FIGS. 2C and 2H, or FIGS. 2D and 2J. In some cases, a device includes at least one component planar substrate 11 that has a fluid retention groove 14, such as shown in FIGS. 2A-2H. In certain instances, a planar substrate 11 having a fluid retention groove 14 is combined with a planar substrate 11 that does not have a fluid retention groove 14, such as shown in FIG. 2I and FIG. 2J. The component planar substrates 11 may have additional features as described herein, such as shown in FIGS. 2E-2H. For simplicity, only a selection of configurations is illustrated in the figures. However, it is understood that devices 10 can include many other configurations of planar substrates 11. In some instances, a device 10 includes component planar substrates 11 that are configured to facilitate use of the device in a microfluidic system. The various aspects and features of the device 10 and the component planar substrates 11 are described in more detail below.

Figure 4A:
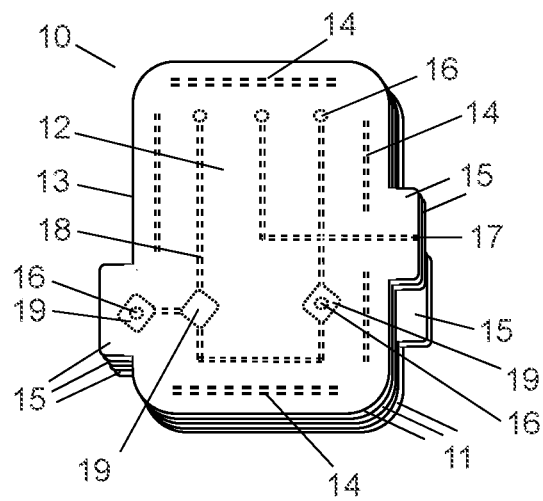
FIG. 4A is an illustration of a device according to some embodiments.
Figure 4B:
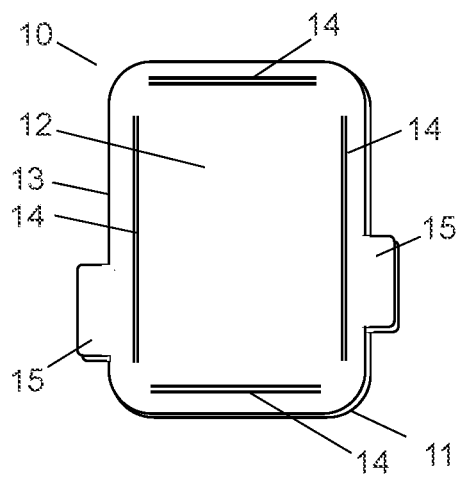
FIGS. 4B-4D are illustrations of component planar substrates according to some embodiments.
Figure 4C:
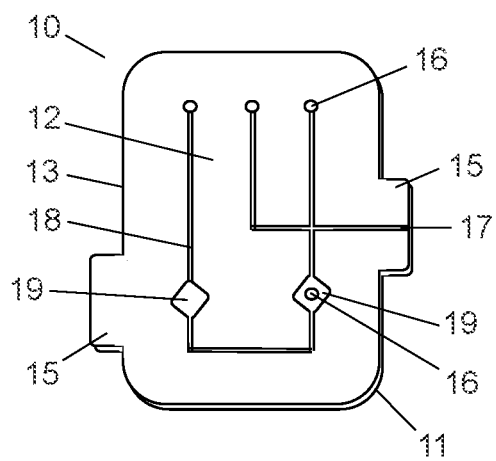
Figure 4D:
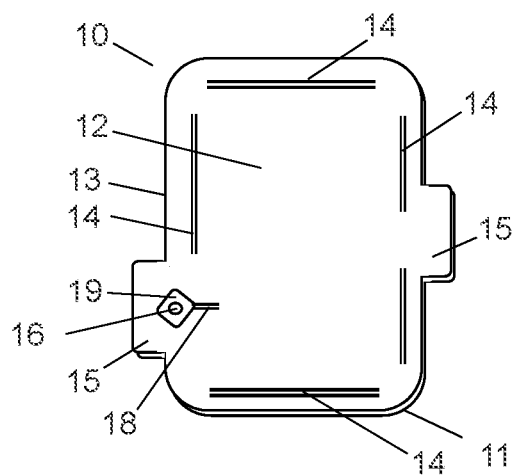

FIG. 4A shows a microscale fluidic device 10 according to another aspect. This device 10 includes three planar substrates 11, each of which has two protrusions 15. Example planar substrates 11 that could be used to make the device 10 of FIG. 4A are shown in FIG. 4B and FIG. 4C. The planar substrates 11 shown in FIG. 4B and FIG. 4D each include a discontinuous fluid retention groove 14. The planar substrates 11 shown in FIG. 4C and FIG. 4D each have at least one microfluidic channel 18 and at least one microfluidic chamber 19. These planar substrates 11 also each include a port 16. In one example, the planar substrates 11 shown in FIG. 4C and FIG. 4D have the same shape such that the peripheral edges 13 and the two protrusions 15 align. In another example, the planar substrate 11 shown in FIG. 4B has two protrusions 15, with the protrusion on the left side aligning with the protrusions 15 on the left side of the planar substrates in FIG. 4C and FIG. 4D. However, in that example, the protrusion on the right side of the planar substrate 11 shown in FIG. 4B does not align with the protrusions 15 of the planar substrates 11 shown in FIG. 4C and FIG. 4D. As shown in FIG. 4A, in some instances even though protrusions 15 in the planar substrates 11 bonded to form the device 10 do not align, they may partially overlap. In one aspect, the microfluidic channels 17 and chambers 18 on different planar substrates 11 can connect to each other when the planar substrates 11 are bonded together. For example, the planar surface of the planar substrate 11 as shown in FIG. 4B can be bonded to the planar surface of the planar substrate 11 as shown in FIG. 4C such that the microfluidic channels 18 and chambers 19 are between the two planar substrates 11 to form part of the device 10 shown in FIG. 4A. In another example, the planar substrate 11 shown in FIG. 4D can be bonded to the other side of the planar substrate 11 shown in FIG. 4C. For example, this configuration may strengthen the protrusion 15 on the left side. In another example, the protrusion 16 on the right of the planar substrate shown in FIG. 4B does not align with the protrusion 16 on the right of the planar substrates shown in FIG. 4C and FIG. 4D. In some instances, this feature may assist in positioning or stabilizing the device 10 within a microfluidic machine or system.

In some cases, the device 10 includes at least two components that are planar substrates 11. For example, the device 10 may include 2, 3 or 4 planar substrates 11. The number of planar substrates 11 bonded together to form the device 10 may be determined based on the desired utility for the device 10. For practical purposes, the number of planar substrates 11 is not limited and a plurality of planar substrates 11 may be bonded together to form a device 10. For simplicity, the example device 10 illustrated in FIG. 1A is shown having two planar substrates 11 as described above. However, it is understood that devices 10 as contemplated within the scope of this disclosure are not limited to having only two components that are planar substrates 11. For example, the device 10 shown in FIG. 4A includes three planar substrates 11. In some instances, the device 10 shown in FIG. 4A can be made by bonding together the planar substrates 11 shown in FIGS. 4B, 4C, and 4D.

In one aspect, the planar surface of the component planar substrate 11 may be formed as various shapes. The shape of the planar substrate 11 may be determined based on the desired utility for the component or device 10. The shape of the planar substrate 11 is not limited by this disclosure, and any suitable shape may be employed according to different embodiments. For example, the planar surface may be in the shape of a square, a rectangle, a triangle, a circle, an oval, or some other shape. In some instances, the shape of the planar surface may be varied. For example, one portion of the planar surface may be rectangular and another portion may have a different shape. A device may include component planar substrates 11 that are the same shape or different shapes from each other. The dimensions of a planar substrate 11 may be governed by the desired utility of the component or device 10. In some cases, the planar substrates 11 of a device 10 may have substantially the same dimensions. For example, planar substrates 11 of a device 10 may have the same depth, height, and width. In some examples, the length or width of a planar substrate 11 may be 0.5 cm to 15 cm. In some instances, the length or width of the planar substrate 11 may be 1 cm to 10 cm. In some cases, the length or width of the planar substrate 11 may be 2 cm to 8 cm. In some examples, the depth of a planar substrate 11 may be 0.2 mm to 4 mm. In some instances, the depth of the planar substrate 11 may be 0.2 mm to 2 mm. In some cases, the depth of the planar substrate 11 may be 0.3 mm to 1.7 mm. In some instances, the depth of the planar substrate 11 may vary across its width and length (for example, getting deeper/thicker at certain points). Alternatively, the planar substrates 11 of a device may have different dimensions from each other. For example, one planar substrate 11 may be deeper than another planar substrate 11. In other examples, the planar substrates 11 of the device 10 may have different shapes from each other. In some examples, the planar substrate 11 may have one or more protrusions 15 or one or more recesses 20. For example, a first planar substrate 11 may have a protrusion 15 or recess 20 while a second planar substrate 11 does not have a protrusion 15 or recess 20 or, alternatively, has a protrusion 15 or recess 20 that does not align with the protrusion 15 or recess 20 of the first planar substrate 11. In another example, a first planar substrate 11 may have a shorter length or width than a second planar substrate 11. For example, a first planar substrate 11 with a planar surface in the shape of a square may be bonded to a second planar substrate 11 with a planar surface in the shape of a rectangle. For simplicity, the example component planar substrates 11 illustrated in each of the figures generally have a planar surface with a rectangular shape and some include a rectangular protrusion 15 and/or a rectangular recess 20. However, it is understood that the component planar substrates 11 as contemplated within the scope of this disclosure are not limited to these shapes.

In various aspects, a component planar substrates 11 may be made of various types of material. In some instances, a device 10 is made from planar substrates 11 made of the same material(s). In some instances, a device 10 may include planar substrates 11 made of different materials. The planar substrate 11 may be made from a polymer. For example, the planar substrate may be made from a copolymer. In some instances, the polymer is a plastic. For example, the planar substrate 11 may be made from an acrylate, a polycarbonate, a polystyrene, a copolymer (COC), or a cyclic-olefin-polymer (COP). In some examples, the acrylate is poly(methyl methacrylate) (PMMA).

In some aspects, a component planar substrate 11 may have a fluid retention groove 14 formed in the planar surface. In one aspect, the fluid retention groove 14 may align along the peripheral edge 13 of the planar surface. For example, when aligned with the peripheral edge 13 of the planar surface, the groove 14 may be parallel or substantially parallel to the peripheral edge 13 of the planar surface. In some cases, the fluid retention groove 14 may surround the central portion 12 of the planar surface and some or all of the features defined therein. In some cases, the groove 14 may flank the central portion 12 of the planar surface on at least two sides. In some instances, the groove 14 may align with the peripheral edge at all positions around the peripheral edge 13 of the planar surface or may align only at some positions around the peripheral edge 13 of the planar surface. In one aspect, the groove 14 is formed no less than 0.3 mm from the peripheral edge of the planar surface. In some instances, the groove 14 may be formed further into the central portion of the planar surface such that it is not substantially parallel to the peripheral edge 13 of the planar surface. For example the groove 14 may be formed around a feature within the central portion 12 of the planar surface (such as a port 16, a microfluidic channel 18, or a microfluidic chamber 19). See, for example, FIGS. 6A-6C. In one aspect, where the groove 14 is formed around a feature within the central portion 12 of the planar surface, it is formed no less than 0.3 mm from the peripheral edge of the feature.

In some instances, the groove 14 is continuous. In other instances, the groove 14 is discontinuous. For example, the groove 14 may be formed so that there are one or more gaps between different portions of the groove 14. In some instances, the groove 14 may have gaps at the corners of the planar surface or may have one or more gaps along one or more sides of the planar surface. For example, the groove 14 may include a gap between a first end and a second end as shown in FIGS. 1A, 1B, 1D, 2D, 2E, 2G, 3A, 3B, 4A, 4D, and 5A and 5B. In another example, the groove 14 may be discontinuous as shown in as shown in FIGS. 1A, 1B, 1D, 2D, 2E, 2G, 3A, 3B, 4A, 4B, 4D, 5A and 5B. However, the discontinuous pattern of the groove 14 is not limited to the embodiments shown. In some instances, the discontinuous pattern of the groove is determined based on the desired utility of the component or device 10. For example, in some instances, the discontinuous pattern of the groove 15 permits formation of device 10 features onto protrusions 15. See, for example, FIG. 4. In another aspect, a component planar substrate 11 may have a plurality of grooves 14. See, for example, FIG. 4. For example, a planar substrate 11 may have two grooves 14. In some instances, the grooves 14 may be parallel, including configurations in which the grooves 14 are uniformly parallel or may only be in parallel at certain points in the planar surface. For example, one groove 14 may be continuous and the other groove 14 may be discontinuous. In another example, two grooves 14 may be discontinuous and aligned in parallel only at certain points in the planar surface.

In one example, the interior of the groove 14 comprises an interior surface and a cross-section. The cross-section of the groove 14 may have various shapes. For example, the cross-section of the groove 14 may be a square or rectangular shape, a rounded shape, a triangular shape, or some other shape. Example groove cross-sections are shown in FIGS. 3A-3C. The cross-section of the groove 14 may a uniform shape throughout the planar substrate 11. For example, the cross-section may have a uniform depth or uniform width throughout the planar substrate 11. Alternatively, the groove 14 may have a different shape or dimensions at different positions in the planar substrate 11. For example, the groove 14 may have a square shape (as shown, for example in FIG. 4C) in one portion of the planar substrate 11 and a rounded shape (as shown for example, in FIG. 4D) in another portion of the planar substrate 11. In one aspect, the cross-section of the groove 14 is generally less deep than the depth of the planar substrate 11 itself. In some instances, the width of the groove 14 is substantially the same throughout the entire length of the groove 14. In some instances, the depth of the groove 14 is substantially the same throughout the entire length of the groove 14. The width of the groove 14 may be variable. In some instances, the cross-section of the groove 14 can have a width of at least 0.2 mm or about 0.2 mm. For example, the cross-section of the groove 14, or at least a portion thereof, can have a width of 0.2 to 1.0 mm, or about 0.2 mm to about 1.0 mm. In some cases, the cross-section of the groove 14 has a depth of at least 0.2 mm or about 0.2 mm. For example, the cross-section of the groove 14, or at least a portion thereof, can have a depth of 0.2 mm to 1.0 mm, or about 0.2 mm to about 1.0 mm. In one aspect, the depth of the planar substrate 11 is at least 0.5 mm greater than the depth of the groove 14. For example, having at least 0.5 mm of planar substrate 11 below the groove 14 can provide sufficient stability to maintain the integrity of the cross-section of the groove 14. In other examples, finer tolerances may be suitable such that there is less of a depth differential between the groove cross-section and the planar substrate 11. In one aspect, a planar substrate 11 that includes a groove 14 has a depth of at least 0.7 mm. In some instances, the shape of the component planar substrate 11 are selected to accommodate the fluid retention groove 14 (for example, within a portion or protrusion 15). In one aspect, the groove 14 is wider than any microfluidic channel 18 in the planar surface of the planar substrate 11. In one aspect, the ratio of the width of the groove 14 to the width of the microfluidic channel 18 is at least 2:1, 3:1, 4:1, 5:1, 6:1, 7:1, 8:1, 9:1, or 10:1. In some instances, in contrast to a microfluidic channel 18, a groove 14 does not have a functional aspect in the context of a formed device 10. For example, liquids (such as chemicals and reagents) do not interact with the groove 14 in the formed device 10.

In some instances, a component planar substrate 11 has a recess 20 that joins the interior surface of the groove to the peripheral edge 13 of the planar surface. The recess 20 permits excess solvent to discharge from between the component planar substrates 11 of a device 10 during the bonding process. In some instances, the planar substrate 11 has more than one recess 20. In one aspect, the recess 20 may have a depth equal to or less than the depth of the groove 14. In another aspect, the recess 20 may have a width that is the distance from the interior surface of the groove 14 to the peripheral edge 13 of the planar substrate 11. In another aspect, a recess 20 may have a length of about 0.2 mm to about 1 mm. In some instances, recess 20 may have a length of 0.2 mm to 1 mm.

In certain instances, a component planar substrate 11 may have one or more microfluidic channels 18 or one or more microfluidic chambers 19. In some cases, a planar substrate 11 has a plurality of microfluidic channels 18 or microfluidic chambers 19. In some cases, a planar substrate 11 has at least one microfluidic channel 18 and at least one microfluidic chamber 19. Example planar substrates 11 and devices 10 having at least one microfluidic channel 18 and at least one microfluidic chamber 19 are shown in FIGS. 1A, 1C, 1D, 2E-2H, 4B, 4C, 5A, 5B, and 6A. Microfluidic channels 18 and microfluidic chambers 19 can be formed within the central portion 12 of the planar surface of a planar substrate 11. In one aspect, a microfluidic channel 18 is a conduit for liquids (such as chemicals, reagents, or samples) once the device 10 is formed and in use. In one aspect, a microfluidic channel 18 can have a width of 0.05 mm to 2 mm. In some instances, a microfluidic channel 18 can have a width of 0.1 mm to 1 mm. In one aspect, a microfluidic chamber 19 is a receptacle or a holding container for liquids (such as chemicals, reagents, or samples) within the device 10 once the device 10 is formed and in use. In some instances, a microfluidic chamber 19 is a contained region within the device 10 into which such liquids are introduced (for example, through a microfluidic channel 18 or a port 16). In one aspect, chemical or biochemical reactions or molecular assays may be performed within a microfluidic chamber 19 in a device 10.

Figure 5A:
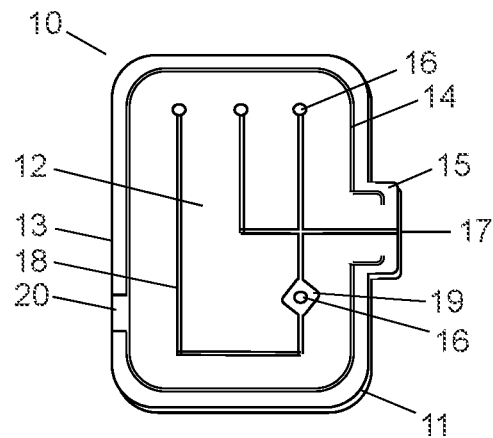
FIG. 5A is an illustration of a component planar substrate according to one embodiment.
Figure 5B:
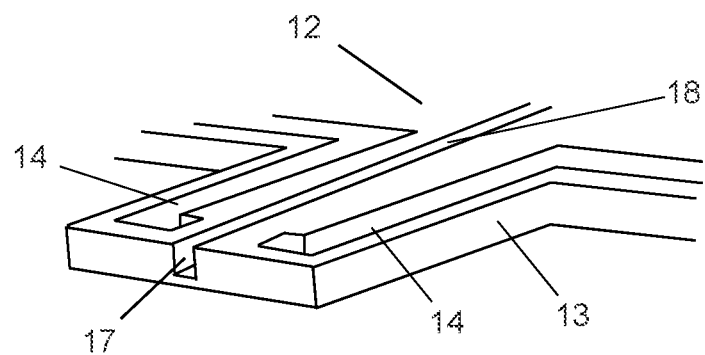
FIG. 5B is an illustration of features of a component planar substrate according to one embodiment.
Figure 5C:
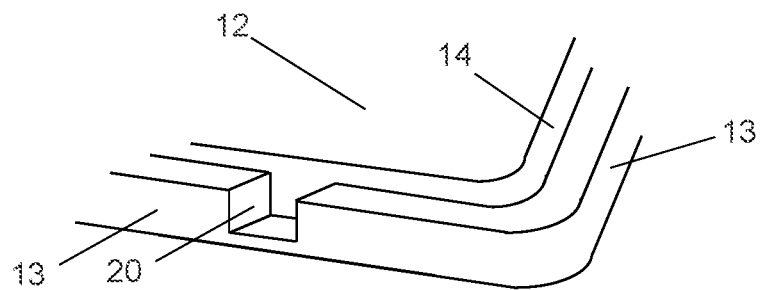
FIG. 5C is an illustration of features of a component planar substrate according to one embodiment.
Figure 6A:
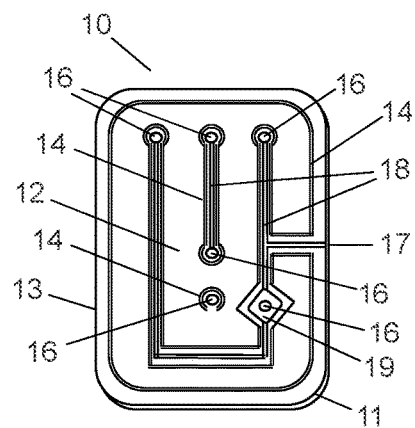
FIG. 6A is an illustration of a component planar substrate according to one embodiment.
Figure 6B:
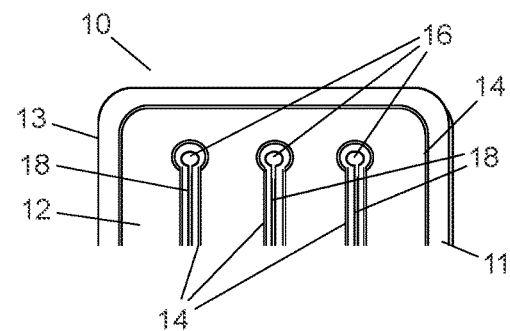
FIG. 6B is an illustration of a portion of a planar substrate according to one embodiment.

In some examples, a planar substrate 11 includes a fluid retention groove 14 and at least one microfluidic channel 18 or at least one microfluidic chamber 19 that are within the perimeter of the fluid retention groove 14. Example planar substrates 11 are shown in FIGS. 1D, 2E, 2G, 4B, 5A, 5B, and 6A. In some examples, a device 10 may include a first planar substrate 11 having a fluid retention groove 14 and at least one microfluidic channel 18 or at least one microfluidic chamber 19 that are within the perimeter of the fluid retention groove 14 and a second planar substrate 11 that does not have a fluid retention groove 14. The second planar substrate 11 may have at least one microfluidic channel 18 or at least one microfluidic chamber 19. Such microfluidic channels 18 and chambers 19 in the second planar substrate 11 may or may not align with any microfluidic channels 18 or chambers 19 in the first planar substrate 11. Example second components are shown in FIGS. 1C, 2F, 2H, and 4C. In certain instances, a fluid retention groove may be defined in the planar surface of the planar substrate 11 around the microfluidic channel 18 or the microfluidic chamber 19. In some aspects, if the microfluidic channel 18 is connected to a microfluidic chamber 19, the fluid retention groove 14 can align along the perimeter of the microfluidic channel 18 and the microfluidic chamber 19 as shown for example in the planar substrate 11 illustrated in FIG. 6A. In another aspect, if the microfluidic channel 18 is connected to a port 16, the groove 14 can align along the perimeter of the microfluidic channel 18 and the port 16 as shown, for example in FIGS. 6A, 6B, and 6C (port 16iii, groove 14iii, channel 17iii). In some instances, the fluid retention groove 14 that aligns along the peripheral edge 13 of the planar surface extends into central portion 12 of the planar surface to surround the microfluidic channel 18 or the microfluidic chamber 19 (for example, to align along the peripheral edge of the microfluidic channel 18 or chamber 19). An example planar substrate 11 with a configuration along this aspect is shown in FIG. 6A. In certain cases, the fluid retention groove 14 that surrounds the microfluidic channel 18 or the microfluidic chamber 19 is not connected to the fluid retention groove 14 that aligns along the peripheral edge 13 of the planar surface. Examples of planar substrates having such configurations are shown in FIG. 6A and FIG. 6B. For simplicity, the example component planar substrates 11 illustrated in each of the figures generally have a plurality of microfluidic channels and at least one microfluidic chamber 19. However, it is understood that the planar substrates 11 as contemplated within the scope of this disclosure are not limited to these configurations.

Figure 6C:
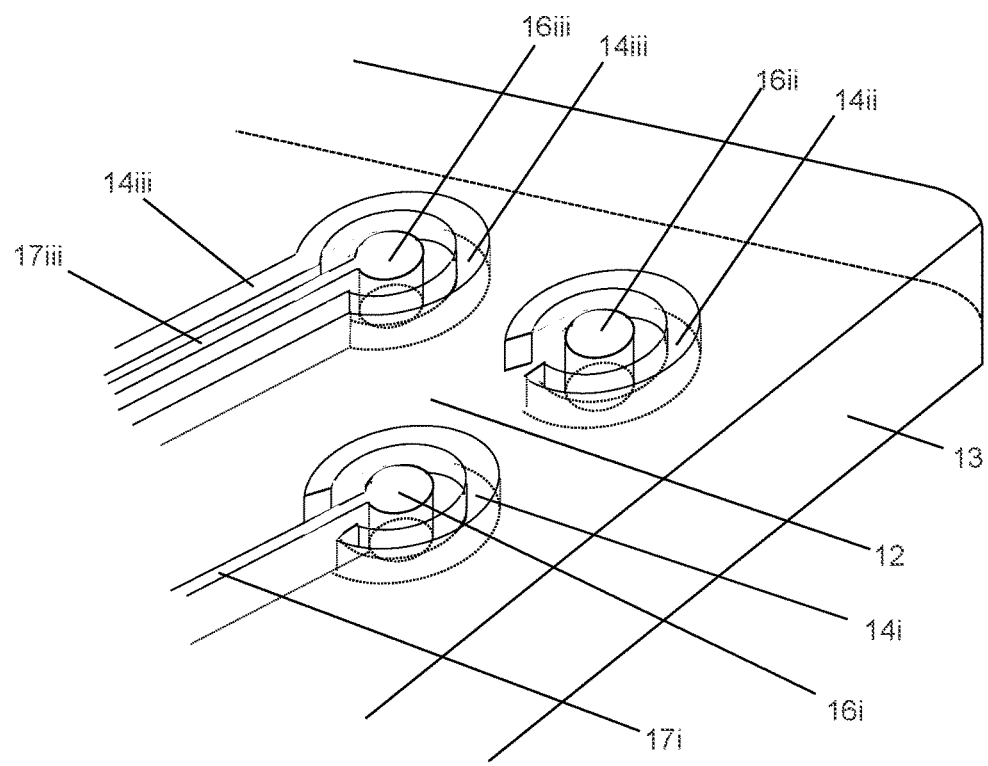
FIG. 6C is an illustration of features of a component planar substrate according to one embodiment.

In some aspects, the microfluidic device 10 may include one or more ports 16 defined in one or more component planar substrates 11. In one aspect, a port may be useful for introducing one or more liquids into a microfluidic channel 18 or chamber 19 or for removing or discharging liquid from a microfluidic channel 18 or chamber 19. In some examples, such liquids include chemicals, reagents, or samples. In one example, the port 16 is defined in the central portion of the planar surface of the planar substrate 11. Examples of planar substrates 11 (and devices 10) having such ports are shown in FIGS. 1A (device 10), 1C, 1D, 2E-2H, 4A (device 10), 4B, 4C, 5A, and 6A-6C. For example, the port may be connected to a microfluidic channel 18. Close up illustrations of such ports are shown in FIG. 6B and FIG. 6C (port 16i). In some instances, the port may not be connected to a microfluidic channel 18. See, for example, FIG. 6A and FIG. 6C (port 16ii). In some aspects, the port 16 may be within a microfluidic chamber 19. Example illustrations of a device having such a port 16 are shown in FIG. 1A and FIG. 4A. Example illustrations of component planar substrates 11 having such a port 16 are shown in FIGS. 1C, 1D, 2E-2H, 4B, 4C, 5A, and 6A. In certain instances, a fluid retention groove 14 may be defined in the planar surface around a port 16 as shown, in some example configurations, in FIG. 6C. In one aspect, if the port 16 is connected to a microfluidic channel 18, the groove 14 may align along the peripheral edge of the port 16 (surrounding the port) but not the microfluidic channel 18 such that a first end and a second end of the groove 14 flank the microfluidic channel 17. One example of a planar substrate 11 having such a port is shown in FIG. 6C (port 16i, channel 17i, groove 14i). In another aspect, if the port 16 is connected to a microfluidic channel 18, the groove 14 may align along the peripheral edges of the port 16 and the microfluidic channel 18 (surrounding both the port 16 and at least a portion of the microfluidic channel 18). One example of a planar substrate 11 having such a port is shown in FIG. 6C (port 16iii, channel 17iii, groove 14iii). In some instances, the fluid retention groove 14 that aligns along the peripheral edge 13 of the planar surface extends into central portion 12 of the planar surface to surround port 16. In certain cases, the fluid retention groove 14 that surrounds the port 16 is not connected to the fluid retention groove 14 that aligns along the peripheral edge 13 of the planar surface. One example of a planar substrate 11 having such ports 16 is shown in FIG. 6C (see groove 14i surrounding port 16i and groove 14ii surrounding port 16ii).

In some aspects, the device 10 may have one or more outlets 17. For example, the opening of the microfluidic channel 18 at the peripheral edge 13 of the planar substrate 11 can form an outlet 17 once the planar substrate 11 with the microfluidic channel 18 is bonded to a second planar substrate 11. An outlet 16 may be useful for removing or discharging fluids (including chemicals, reagents, or samples) into the microfluidic channel 18 or microfluidic chambers 19 of a device 10. In some examples, a component planar substrate 11 may include a microfluidic channel 18 that extends from the central portion 12 to the peripheral edge 13 of the planar surface. In some cases, the peripheral edge 13 to which the microfluidic channel 18 extends is the edge of a protrusion 15 of the planar substrate 11. Examples of this feature are shown in FIGS. 1A, 1C, 1D, 2E-2H, 4A, 4C, 5A, 5B, and 6A. FIG. 5B shows a close up example of this aspect. In certain instances, the planar substrate 11 has a fluid retention groove 14 and the microfluidic channel 18 at the peripheral edge, or outlet 16, is flanked by a first end and a second end of the microfluidic groove 14. See, for example, FIGS. 1D, 2E and 2G. In other examples, the fluid retention groove 14 may be on a first planar substrate 17, and a first and second end of the fluid retention groove 14 may flank the microfluidic channel 18 of a second planar substrate 11 when the two planar substrates 11 are aligned. Example planar substrates 11 that can be bonded to form this configuration are show in FIG. 1B and FIG. 1C, FIG. 2B and FIG. 2F, and FIG. 2D and FIG. 2H. In some cases, where the microfluidic channel 18 extends to the peripheral edge 13 of a planar substrate that is a protrusion 15, and the protrusion 15 may have dimensions sufficient to accommodate both the microfluidic channel 18 and the fluid retention groove 14 (whether on the same or a separate planar substrate 11).

The component planar substrates 11 may have various features, such as a fluid retention groove 14, one or more microfluidic channels 18, one or more microfluidic chambers 19, one or more ports 16, one or more outlets 17, or one or more recesses 20. These features may be incorporated into a planar substrate 11 by various methods. For example, in some instances, the features may be defined in the planar surface of a planar substrate 11 by etching, micromilling, hot embossing, stamping, or injection-molding. For example, the fluid retention groove 14 may be formed in a planar substrate 11 using one of these methods.

In some cases, the planar surface of the component and the interior surface of the groove are coated with a compound or substance that improves the solvent bonding process. In some cases, the planar surface of the component and the interior surface of the groove are chemically treated in a manner that may improve the solvent bonding process. For example, the planar surface of the component and the interior surface of the groove may be treated with $O_2$ plasma. In some instances, the planar surface of the component and interior surface of the groove may be hydrophilic.

II. Methods

Figure 7:
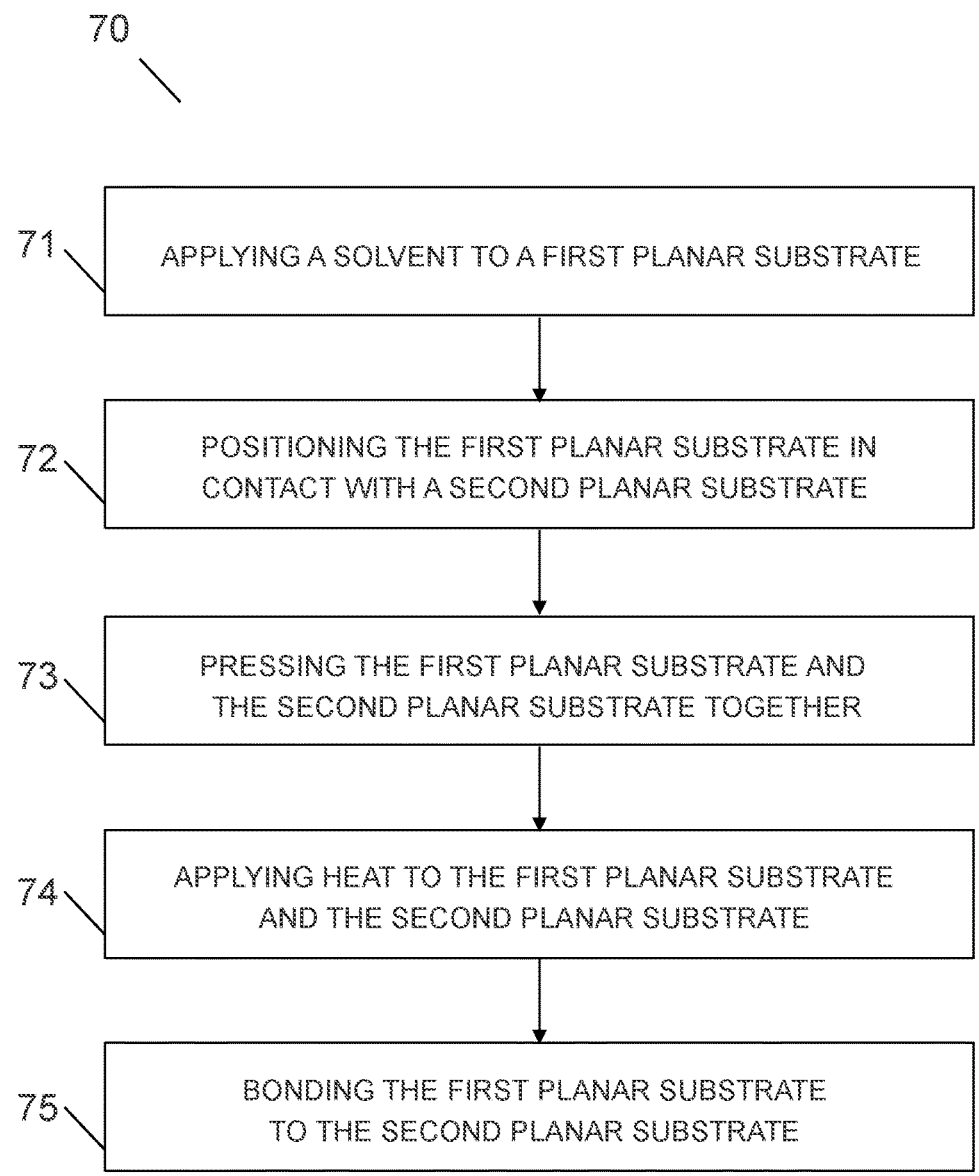
FIG. 7 is a block diagram of a method of making a device according to one embodiment.

Microfluidic devices 10 can be made by various methods. FIG. 7 is a block diagram illustrating methods for making a microfluidic device 10 according to certain embodiments. The method 70 is described with respect to the devices 10 and component planar substrates 11 described herein and illustrated in FIGS. 1-6. In some instances, solvent bonding is used to attach a first planar substrate 11 to a second planar substrate 11. At least one of the planar substrates 11 includes a fluid retention groove 14. In one aspect, a solvent is applied to the planar surface of at least one of the planar substrates 11 as shown in step 71. In another aspect, following application of the solvent, the planar surfaces of the first and second planar substrates 11 are brought into contact (positioned) so that the solvent is between the planar substrates as described in step 72. In some instances, the solvent partially dissolves each of the planar surfaces of the planar substrates 11 to bond the two surfaces together. In some instances, some solvent can be retained in the fluid retention groove 14 when the planar substrates 11 are in contact with each other. In certain cases, some solvent may be discharged from between the planar substrates 11 when they are put in contact with each other through a recess 20 in the fluid retention groove 14. In some cases, pressure is applied to the outer surfaces of the planar substrates 11 to press them together as described in step 73. In certain instances, heat is applied to the planar substrates 11 after they are positioned in contact with each other as described in step 74. In some examples, both pressure and heat are applied to the planar substrates 11. The planar substrates 11 remain in contact until they are bonded together as described in step 75.

In one aspect, the first and second planar substrates 11 may be aligned prior to being bonded. For example, for a device 10 that includes planar substrates 11 having planar surfaces of the same shape, the peripheral edges of the planar substrates 11 may be aligned and that the central portions 12 of the planar surfaces are in contact. In another example, for a device 10 that includes planar substrates 11 having planar surfaces of different shapes, a portion of the peripheral edges 13 of the planar substrates 11 may be aligned. In certain instances, when the first and second planar substrates 11 are aligned and in contact, the fluid retention groove that is a first planar substrate 11 is enclosed by the planar surface of the second planar substrate 11. In certain examples, a device 10 includes a first planar substrate 11 having a microfluidic channel 18 or microfluidic chamber 19, and when the first planar substrate 11 is aligned with a second planar substrate 11, the portion of the planar surface of the first planar substrate 11 containing the microfluidic channel 18 or microfluidic chamber 19 is aligned and in contact with the planar surface of the central portion 12 of the second planar substrate 11. In other words, in some instances, the microfluidic channel 18 or the microfluidic chamber 19 of the first planar substrate 11 is enclosed by the planar surface of the second planar substrate 11.

In one aspect, the solvent bonding process may include applying force (pressure) on the portions of the planar substrates 11 opposite the planar surfaces that are in contact to press the planar substrates 11 together. In one aspect, the amount of force applied to the planar substrates 11 is in the range of 5 lbf (~20 N) to 3000 lbf (~13 kN). In some cases, the force applied is scaled to the area of the substrate to achieve the appropriate pressure for bonding. In one aspect, the amount of pressure applied to the planar substrates 11 is in the range of 5 PSI to 1000 PSI, or about 5 PSI to about 1000 PSI. For example, the amount of pressure applied can be about 50 PSI to about 500 PSI, or about 100 PSI to about 700 PSI, or about 10 PSI to about 600 PSI, or about 400 PSI to about 900 PSI. In another example, the amount of pressure applied can be 50 PSI to 500 PSI, or 100 PSI to 700 PSI, or 10 PSI to 600 PSI, or 400 PSI to 900 PSI.

In one aspect, the bonding process can be performed at various temperatures. For example, the process can be performed at a temperature in the range of about 0° C. to about 90° C. In some instances, the process can be performed at a temperature greater or equal to 0° C., or about 0° C., and less than or equal to 90° C., or about 90° C. The temperature can vary based on the material of the planar substrates (11) and the solvent being used for the bonding process. In one aspect, the solvent bonding process may include heating the planar substrates 11 when the planar substrates 11 are being pressed together after application of the solvent and alignment. For example, the planar substrates 11 may be placed in a heated environment when they are being pressed together. In some instances, the heated environment may be an enclosed heated environment such as oven. In another instances, the planar substrates 11 may be placed on a heated surface, such as a hotplate, or between heated surfaces, such as heated patents) and pressed together while in contact with the heated surface(s). In one aspect, the heated environment, including an enclosed heated environment or heated surface(s) is heated to a temperature in the range of 37° C. to 90° C., or about 37° C. to about 90° C. In some cases, the heated environment is heated to a temperature in the range of 40° C. to 75° C., or about 40° C. to about 75° C. In some cases, the solvent bonding process may involve both pressing the planar substrates 11 together and heating them at the same time.

In one aspect, the planar substrates may be bonded to each other after a period of time being pressed together. In one aspect, applying pressure to press the planar substrates 11 together or heating the planar substrates 11 may accelerate the bonding process. In another aspect, the temperature to which the planar substrates are heated is below the boiling point of the solvent used in the bonding process. In some instances, the temperature to which the planar substrates 11 are heated is selected based on the substrate material or solvent used in the bonding process. For example, the bonding process can occur in a minimum of 30 second, or about 30 seconds, to a maximum of 20 minutes, or about 20 minutes. In another aspect, the bonding process can occur in 30 seconds to 49 minutes, or about 30 sec to about 49 min, In another aspect, the bonding process can occur in 2-20 min, or about 2 min to 20 min. In another aspect, the bonding process can occur in 5-20 minutes, or about 5 minutes to about 20 min.

A variety of solvents may be used for the solvent bonding process. In one aspect, the solvent is an aqueous solvent. In some instances, the solvent may be an organic solvent. For example, the solvent may be acetone, acetonitrile, isopropanol, dichloromethane, n-hexanol, chloroform, cyclohexane, or a combination of one or more of these solvents. In some examples, the solvent is acetone. In one aspect, the concentration of the solvent may vary. For example, the solvent can be 40-100% in concentration. In some instances, the solvent concentration may be 50-85%. For example, the solvent concentration may be at least 40%, at least 45%, at least 50%, at least 55%, at least 60%, at least 65%, at least 70%, at least 75%, at least 80%, at least 85%, at least 90%, or at least 95%. In some cases, the solvent concentration is 50%, or about 50%. In some instances, the solvent is diluted with water. For example, solvents such as acetone, acetonitrile, or isopropanol can be diluted with water. In some cases, a solvent is diluted in a second organic solvent. For example, solvents such as dichloromethane, n-hexanol, and chloroform can be diluted in a second organic solvent such as, for example, each other.

The solvent used for the solvent bonding process may be selected based on the material that the planar substrate 11 is made from. The planar substrate 11 may be made from a polymer. For example, the planar substrate may be made from a co-polymer. In some instances, the polymer is a plastic. For example, the planar substrate 11 may be made from an acrylate, a polycarbonate, a polystyrene, a copolymer (COC), or a cyclic-olefin-polymer (COP). In some examples, the acrylate is poly(methyl methacrylate) (PMMA). In some instances, the solvent selected is acetone regardless of the planar substrate 11 material. In some examples, if the material is polystyrene, the solvent selected may include acetonitrile. In some examples, if the material is an acrylate, such as PMMA, the solvent selected may include acetone. In some examples, if the material is polycarbonate, the solvent selected may include dichloromethane. In some examples, if the material is COC or COP, the solvent selected may include isopropanol or dichloromethane. A factor that can be considered in selecting the solvent is the Hildebrand solubility parameter ($\delta$). The Hildebrand solubility parameter ($\delta$) provides a numerical estimate of the degree of interaction between materials, and can be a good indication of solubility, particularly for nonpolar materials such as many polymers. Materials with similar values of $\delta$ are likely to be miscible. Thus, a solvent can be selected that has a similar value of $\delta$ to the material(s) of the planar substrate(s) to be bonded together.

In some cases, the planar surface of the component and the interior surface of the groove are coated with a compound or substance that improves the solvent bonding process. In some cases, the planar surface of the component and the interior surface of the groove are chemically treated in a manner that may improve the solvent bonding process. For example, the planar surface of the component and the interior surface of the groove may be treated with $O_2$ plasma. In some instances, the planar surface of the component and interior surface of the groove may be hydrophilic.

The foregoing description of certain embodiments, including illustrated embodiments, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure. Certain features that are described in this specification in the context of separate embodiments can also be implemented in combination in a single implementation. Conversely, various features that are described in the context of a single implementation can also be implemented in multiple ways separately or in any suitable subcombination. Moreover, although features may be described above as acting in certain combinations, one or more features from a combination can in some cases be excised from the combination, and the combination may be directed to a subcombination or variation of a subcombination. Thus, particular embodiments have been described. Other embodiments are within the scope of the disclosure.

All printed patents and publications referred to in this application are hereby incorporated herein in their entirety by this reference.

What is claimed is:

1. A microfluidic device component, comprising a planar substrate having a planar surface, wherein the planar surface comprises a central portion, a peripheral edge, and a groove having a cross-section defined in the planar surface, wherein the groove aligns along the peripheral edge of the planar surface;

and wherein the planar surface further comprises a microfluidic channel or a microfluidic chamber defined therein for holding liquids for performing a chemical or biochemical reaction or assay;

and wherein the groove is separate from the microfluidic channel or microfluidic chamber such that liquids within the microfluidic channel or microfluidic chamber cannot interact with the groove.

2. The microfluidic device component of claim 1, wherein the groove is a single continuous groove.

3. The microfluidic device component of claim 1, wherein the groove is discontinuous.

4. The microfluidic device component of claim 1, wherein the planar surface comprises two grooves defined therein.

5. The microfluidic device component of claim 1, wherein the microfluidic channel or the microfluidic chamber is positioned within the perimeter of the groove.

6. The microfluidic device component of claim 1, wherein a second fluid retention groove is defined in the planar surface to surround the microfluidic channel or the microfluidic chamber.

7. The microfluidic device component of claim 1, wherein the planar surface comprises at least one of a port defined therein or a protrusion.

8. The microfluidic device component of claim 1, wherein a microfluidic channel extends to the peripheral edge of the planar surface thereby forming an outlet, and wherein a first end and a second end of the groove flank the microfluidic channel.

9. The microfluidic device component of claim 1, wherein the planar substrate comprises a portion of an outlet, wherein the portion of the outlet comprises a microfluidic channel defined in the planar surface that extends from the central portion of the planar surface to the peripheral edge of the planar surface.

10. The microfluidic device component of claim 1, wherein the groove comprises an interior surface and a recess defined therein, wherein the recess joins the interior surface of the groove to the peripheral edge of the planar surface.

11. The microfluidic device component of claim 1, wherein the planar substrate comprises an acrylate, a polycarbonate, a polystyrene, a copolymer (COC), or a cylic-olefin-polymer (COP).

12. A microfluidic device comprising:
   a first planar substrate having a first planar surface, wherein the first planar surface comprises a central portion, a peripheral edge, and a groove having a cross-section defined in the first planar surface, wherein the groove aligns along the peripheral edge of the first planar surface, and
   a second planar substrate having a second planar surface;
   wherein the second planar surface comprises a second central portion and a second peripheral edge, and wherein the second planar surface of the second planar substrate is adjoined to the first planar surface of the first planar substrate;
   and wherein the second planar substrate comprises a microfluidic channel or a microfluidic chamber defined therein for holding liquids for performing a chemical or biochemical reaction or assay;
   and wherein when the first planar surface and the second planar surface are joined together, the groove is separate from the microfluidic channel or microfluidic chamber such that liquids within the microfluidic channel or microfluidic chamber cannot interact with the groove.

13. The microfluidic device of claim 12, wherein the peripheral edge of the first planar substrate and the second peripheral edge of the second planar substrate are aligned, and wherein the central portion of the first planar substrate and the second central portion of the second planar substrate are aligned.

14. The microfluidic device of claim 12, wherein the microfluidic channel or the microfluidic chamber in the second planar surface of the second planar substrate is within the perimeter of the groove of the first planar substrate when the first planar surface and the second planar surface are aligned.

15. The microfluidic device of claim 12, wherein a second fluid retention groove is defined in the second planar surface to surround the microfluidic channel or the microfluidic chamber.

16. The microfluidic device of claim 12, wherein the first planar surface of the first planar substrate has a second microfluidic channel defined therein, wherein the second microfluidic channel extends from the peripheral edge of the first planar surface into the central portion of the first planar surface.

17. The microfluidic device of claim 16, wherein the groove in the first planar surface of the first planar substrate comprises a first end and a second end that flank the microfluidic channel in the first planar surface of the first planar substrate.

18. The microfluidic device of claim 16, wherein a second fluid retention groove is defined in the first planar surface to surround the second microfluidic channel or the microfluidic chamber in the first planar surface of the second planar substrate.

19. The microfluidic device of claim 12, wherein the microfluidic channel in the second planar surface of the second planar substrate extends from the second peripheral edge of the second planar surface into the second central portion of the second planar surface.

20. The microfluidic device of claim 19, wherein the groove in the first planar surface of the first planar substrate comprises a first end and a second end that flank the microfluidic channel in the second planar surface of the second planar substrate when the first planar surface and the second planar surface are aligned.

21. The microfluidic device of claim 12, wherein the microfluidic device comprises at least one of (i) an outlet or (ii) a port defined in at least one of the first planar surface of the first planar substrate or the second planar surface of the second planar substrate.

22. The microfluidic device of claim 21, wherein the outlet comprises a microfluidic channel defined in the first planar surface of the first planar substrate, wherein the microfluidic channel extends from the peripheral edge of the planar surface into the central portion of the planar surface.

23. The microfluidic device of claim 21, wherein the outlet comprises a microfluidic channel defined in the second planar surface of the second planar substrate, wherein the microfluidic channel extends from the second peripheral edge of the second planar surface into the second central portion of the second planar surface.

24. A method of making a microfluidic device, comprising:
   (a) providing a first planar substrate having a first planar surface, wherein the first planar surface comprises a first central portion, a first peripheral edge, and a groove having a cross-section defined in the first planar surface, wherein the groove aligns along the first peripheral edge of the first planar surface;
   (b) providing a second planar substrate, wherein the second planar substrate comprises a second planar surface, wherein the second planar surface comprises a second central portion, a second peripheral edge, and wherein at least one of the first planar substrate and the second planar substrate comprises a microfluidic channel or a microfluidic chamber defined therein for holding liquids for performing a chemical or biochemical reaction or assay;
   (c) applying solvent to at least one of the first planar surface or the second planar surface; and
   (d) contacting the first planar surface to the second planar surface, wherein the solvent partially dissolves each of the first and second planar surfaces thereby bonding the first and second planar surfaces together;
   wherein when the first planar surface and the second planar surface are bonded together, the groove and the microfluidic channel or microfluidic chamber are separate such that liquids within the microfluidic channel or microfluidic chamber cannot interact with the groove.

25. The method of claim 24, wherein the method further comprises applying pressure or heat to the first and second planar surfaces to facilitate bonding.

26. The method of claim 24, wherein the solvent comprises an organic solvent.

27. The method of claim 24, wherein the solvent comprises acetone or isopropanol, dichloromethane, n-hexanol, chloroform, or acetonitrile.

28. The method of claim 24, further comprising at least one of applying $O_2$ plasma to the first planar substrate or the second planar substrate or applying the solvent to the first planar substrate and the second planar substrate.

29. The microfluidic device component of claim 1, wherein the planar substrate is a first planar substrate, the microfluidic device component further comprising a second planar substrate having a second planar surface, wherein the second planar surface comprises a second central portion and a second peripheral edge, and wherein the second planar surface of the second planar substrate is adjoined to the planar surface of the first planar substrate.

* * * * *